United States Patent
Wagner et al.

(10) Patent No.: US 11,831,325 B2
(45) Date of Patent: Nov. 28, 2023

(54) HOMOGENEITY ENFORCED CALIBRATION FOR PIPELINED ADC

(71) Applicant: Infineon Technologies AG, Neubiberg (DE)

(72) Inventors: Matthias Wagner, Engerwitzdorf (AT); Thomas Bauernfeind, Arbing (AT); Oliver Lang, Natternbach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 128 days.

(21) Appl. No.: 17/579,022

(22) Filed: Jan. 19, 2022

(65) Prior Publication Data

US 2023/0231568 A1    Jul. 20, 2023

(51) Int. Cl.
| | | |
|---|---|---|
| H03M 1/10 | (2006.01) | |
| H03M 1/16 | (2006.01) | |
| H03M 1/44 | (2006.01) | |
| H03M 1/06 | (2006.01) | |

(52) U.S. Cl.
CPC ........... *H03M 1/1023* (2013.01); *H03M 1/16* (2013.01); *H03M 1/44* (2013.01); *H03M 1/0695* (2013.01)

(58) Field of Classification Search
CPC .... H03M 1/1023; H03M 1/44; H03M 1/0695; H03M 1/16
USPC ........................................... 341/18, 120, 161
See application file for complete search history.

(56) References Cited

U.S. PATENT DOCUMENTS

| | | | |
|---|---|---|---|
| 6,822,601 B1 | 11/2004 | Liu et al. | |
| 7,592,938 B2 * | 9/2009 | Hsueh | H03M 1/1019 341/161 |
| 7,671,769 B2 * | 3/2010 | Cesura | H03M 1/1004 341/161 |
| 10,693,485 B1 | 6/2020 | Zhang et al. | |
| 2005/0275572 A1 | 12/2005 | Bjornsen | |
| 2012/0249348 A1 | 10/2012 | Siragusa | |
| 2013/0187802 A1 | 7/2013 | De Figueiredo | |

(Continued)

OTHER PUBLICATIONS

Chen et al., "USER-SMILE: Ultrafast Stimulus Error Removal and Segmented Model Identification of Linearity Errors for ADC Built-in Self-Test," IEEE Transactions on Circuits and Systems—I: Regular Papers, vol. 65, No. 7, Jul. 2018, pp. 2059-2069, 11 pages total.

(Continued)

*Primary Examiner* — Khai M Nguyen
(74) *Attorney, Agent, or Firm* — Slater Matsil, LLP (57) ABSTRACT

A method of operating a pipelined analog-to-digital converter (ADC) having a plurality of output stages includes: performing a first calibration process for the pipelined ADC to update a parameter vector of the pipelined ADC, where components of the parameter vector are used for correcting nonlinearity of the pipelined ADC, where performing the first calibration process includes: providing an input signal to the pipelined ADC; converting, by the pipelined ADC, the input signal into a first digital output; providing a scaled version of the input signal to the pipelined ADC, where the scaled version of the input signal is generated by scaling the input signal by a scale factor; converting, by the pipelined ADC, the scaled version of the input signal into a second digital output; and calibrating the pipelined ADC using the first digital output and the second digital output.

20 Claims, 7 Drawing Sheets

(56) References Cited

U.S. PATENT DOCUMENTS

2016/0182073 A1    6/2016   Speir et al.

OTHER PUBLICATIONS

Ciochina et al., "Analysis of an LMS Algorithm for Bilinear Forms," in 22nd International Conference on Digital Signal Processing (DSP), London, UK, 2017.
Jin et al., "Accurate Testing of Analog-to-Digital Converters Using Low Linearity Signals with Stimulus Error Identification and Removal," IEEE Transactions on Instumentation and Measurement, vol. 54 No. 3, Jun. 2005, pp. 1188-1199, 12 pages total.
Parthasarathy et al., "A Histogram Based AM-BIST Algorithm for ADC Characterization Using Imprecise Stimulus," Department of Electrical and Computer Engineering, Iowa State University, 2002 IEEE, pp. II-274-II-277, 4 pages total.
Schat, Jan, "ADC Test Methods using an impure Stimulus: a Survey," 2018 23rd IEEE Test Symposium (ETS), 5 pages.

\* cited by examiner

HOMOGENEITY ENFORCED CALIBRATION FOR PIPELINED ADC

TECHNICAL FIELD

The present invention relates generally to systems and methods for pipelined analog-to-digital converter.

BACKGROUND

Analog-to-digital converters (ADCs) are used in a wide variety of digital systems for interfacing the analog world with the digital signal processing blocks of the digital systems. Pipelined analog-to-digital converter (ADC) has become one of the most popular ADC architectures for sampling rates ranging from a few mega-samples per second (Msps) up to 100 Msps or more. Resolutions of pipelined ADCs (may also be referred to as pipeline ADCs) may range from eight bits at the faster sample rates up to 16 bits at the lower rates. These resolutions and sampling rates cover a wide range of applications, including CCD imaging, ultrasonic medical imaging, digital receivers, base stations, digital video (for example, HDTV), xDSL, cable modems, and fast Ethernet.

Due to various factor such as component variations (e.g., deviation from nominal values), temperature drift, and/or component aging, the transfer function of ADCs may not be perfect, and may exhibit nonlinear behavior such as offsets and/or gain deviations from the ideal transfer function. Calibration of the ADCs may be performed to correct or compensate for the nonlinearity of the ADCs. Traditional calibration processes may require a highly accurate and/or linear signal generator to generate the calibration signal and may require special hardware setup for the calibration processes, and therefore, may have to be performed, e.g., at the factory where the ADCs are being manufactured. There is a need in the art for ADC calibration processes that can be performed easily and on-demand in the field without using highly accurate signal generators.

SUMMARY

In accordance with an embodiment, a method of operating a pipelined analog-to-digital converter (ADC) having a plurality of output stages includes: performing a first calibration process for the pipelined ADC to update a parameter vector of the pipelined ADC, where components of the parameter vector are used for correcting nonlinearity of the pipelined ADC, where performing the first calibration process includes: providing an input signal to the pipelined ADC; converting, by the pipelined ADC, the input signal into a first digital output; providing a scaled version of the input signal to the pipelined ADC, where the scaled version of the input signal is generated by scaling the input signal by a scale factor; converting, by the pipelined ADC, the scaled version of the input signal into a second digital output; and calibrating the pipelined ADC using the first digital output and the second digital output.

In accordance with an embodiment, an analog-to-digital converter system includes: an input terminal configured to receive an input signal; a pipelined analog-to-digital converter (ADC); a first path between the input terminal and the pipelined ADC, wherein when selected, the first path couples the input terminal to the pipelined ADC; a second path between the input terminal and the pipelined ADC, wherein the second path comprises a scaling circuit configured to scale a signal by a scale factor, wherein when selected, the second path sends a scaled version of the input signal to the pipelined ADC; selection circuits configured to select the first path or the second path based on a control signal of the analog-to-digital converter system; and a correction circuit configured to generate a first corrected output for the pipelined ADC based on a first digital output of the pipelined ADC, wherein the first digital output is an output of the pipelined ADC when the first path is selected.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EXAMPLES

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar numerals in different figures refer to the same or similar component.

The present disclosure will be described with respect to examples in a specific context, namely pipelined ADC systems with built-in calibration capability.

Figure 1:
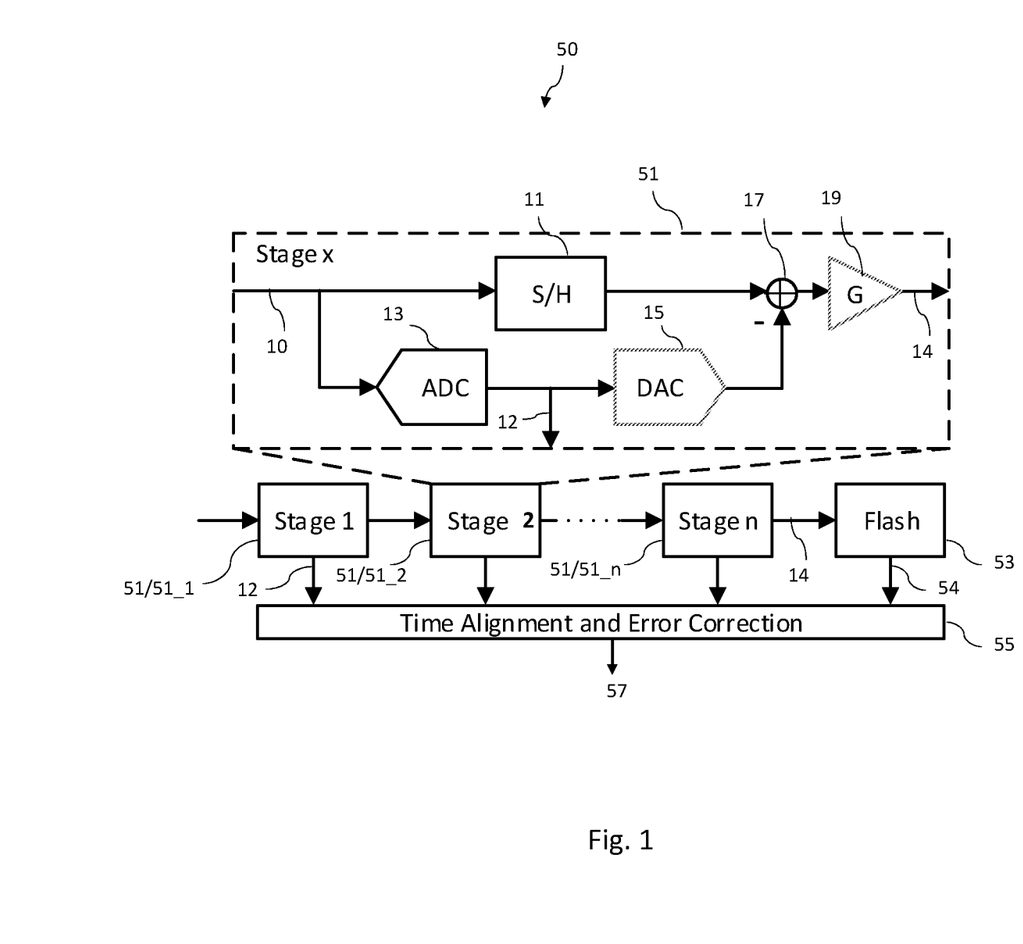
FIG. 1 illustrates a block diagram of a pipelined ADC, in an embodiment.

FIG. 1 illustrates a block diagram of a pipelined analog-to-digital converter (ADC) 50, in an embodiment. As illustrated in FIG. 1, the pipelined ADC 50 includes a plurality of stages 51 (e.g., 51_1, 51_2, . . . , and 51_n) cascaded together, with a flash ADC 53 coupled to an output terminal 14 of the last stage 51_n of the pipelined ADC 50. The plurality of stages 51 (also referred to as output stages 51, or ADC stages 51) are the same (e.g., having the same structure). In particular, each stage 51 includes a sample-and-hold (S/H) circuit 11 for holding (e.g., storing) an input signal (e.g., an analog signal) at an input terminal 10 of the stage 51. The input signal is quantized by an ADC 13 (e.g., a 3-bit flash ADC) into a digital output (e.g., a 3-bit digital signal), the digital output of the ADC 13 is sent to an output terminal 12 as the stage output of the stage 51. The digital output of the ADC 13 is then converted into an analog signal by a digital-to-analog converter (DAC) 15. The output of the DAC 15 is subtracted from the output of the S/H circuit 11 by a subtraction circuit 17 (e.g., a coupler). The residue signal at the output of the subtraction circuit 17 is amplified by an amplifier circuit 19 (which has a pre-determined gain factor), and is sent to an output terminal 14 of the stage 51. The flash ADC 53 (e.g., a 4-bit flash ADC) converts the signal at the output terminal 14 of the last stage 51_*n* into a digital output (e.g., a 4-bit digital signal) at an output terminal 54 of the flash ADC 53. The stage outputs from all of the stages 51 and the digital output of the flash ADC 53 are sent to a Time Alignment and Error Correction circuit 55, which processes the stages outputs of the stages 51 and the output of the flash ADC 53 to produce the output signal 57 of the pipelined ADC 50.

The architecture of pipelined ADC allows the use of low-resolution ADCs 13 in each of the stages 51, and still generates a high-resolution output signal 57. For example, the pipelined ADC 50 may have four stages 51 cascaded together, the ADC 13 in each stage 51 may be a 3-bit flash ADC, the amplifier circuit 19 in each stage 51 may have a gain factor of 4, the flash ADC 53 may be a 4-bit flash ADC, and the final resolution of the output signal 57 of the pipelined ADC 50 is 12 bits. Pipeline ADC as illustrated in FIG. 1 is known, and therefore, further details are not discussed here.

Many state-of-the-art signal processing systems require analog-to-digital converters (ADCs) with a high sampling rate, a high dynamic range, and high linearity. Pipelined ADCs are a popular choice for such challenging applications. The time-interleaved architecture of pipelined ADCs enables high sampling frequencies, but it may introduce error sources. Besides random errors such as thermal noise and quantization noise, there are systematic errors caused by, e.g., DAC 15 inaccuracies or gain mismatches (e.g., the gain factor of the amplifier circuit 19 deviating from its nominal value). To maintain high linearity, calibration techniques are used to correct or compensate for these systematic errors. In order to reduce power consumption and relax the analog design, it is advantageous to perform the calibration in digital domain. Skilled artisans will readily appreciate that errors in the first few stages (e.g., stages in the left of FIG. 1) of the pipelined ADC 50 impact the performance (e.g., accuracy) of the pipelined ADC 50 more than the latter stages (e.g., stages in the right of FIG. 1). Therefore, to reduce computational load, sufficient calibration performances may be achieved by performing the calibration process for the most significant stages (e.g., the first few stages).

Figure 2:
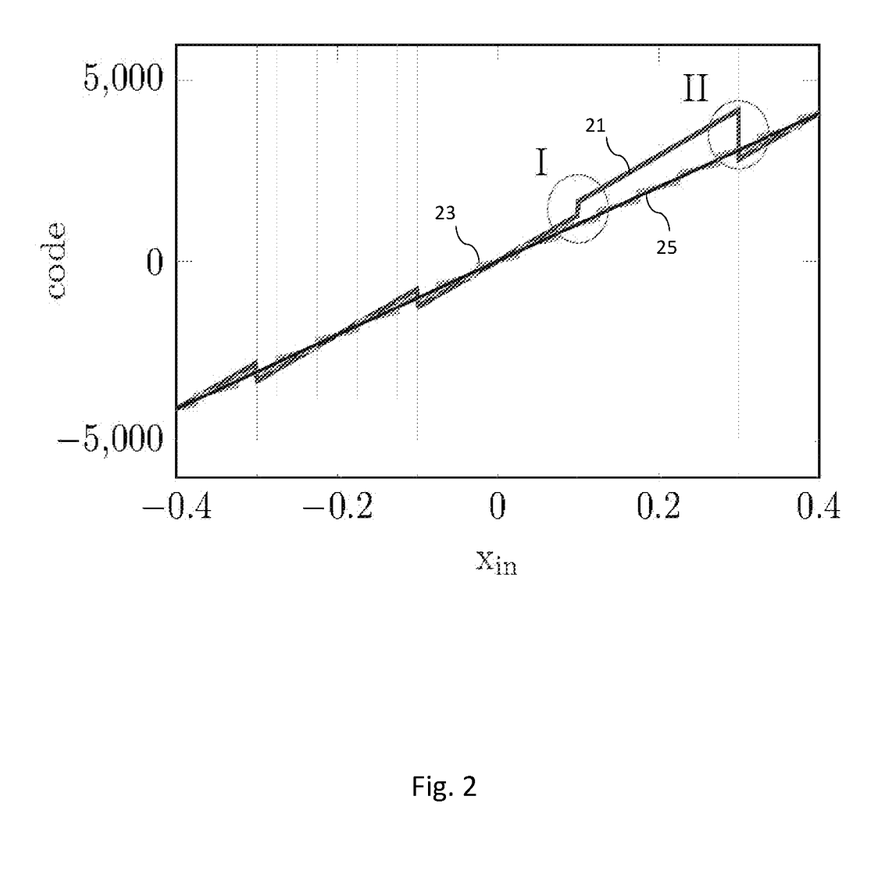
FIG. 2 illustrates the transfer function of a pipelined ADC, in an embodiment.

FIG. 2 illustrates the transfer function of the pipelined ADC 50, in an embodiment. The x-axis in FIG. 2 illustrates the input signal voltage, and the y-axis illustrates the output (also referred to as the output code) of the pipelined ADC. In FIG. 2, the segmented line 21 illustrates the contribution to the output by the first stage 51_1 of the pipelined ADC, and the segmented line 23 illustrates the contribution to the output by the second stage 51_2. For comparison, FIG. 2 also shows a straight line 25 which illustrates an ideal linear response of the pipelined ADC.

The components in each stages 51 of the pipelined ADC 50 may deviate from their nominal values due to, e.g., manufacturing variations, temperature drift, or component aging. For example, the output level of the DAC 15 in each stage 51 and the gain factor of the amplifier circuit 19 in each stage 51 may not match their ideal or nominal values. These mismatches may cause discontinuities in the transition function. As illustrated in FIG. 2, gain factor mismatches result in non-ideal slopes of the corresponding segments while an offset (e.g., vertical offset) is added by DAC errors. FIG. 2 also shows an example of missing code in area I, and an example of output discontinuity in area II.

As illustrated in FIG. 2, due to the specific behavior of pipelined ADCs, the transfer function might suffer from non-monotonous errors (see area II) or missing codes (see area I). Consequently, an inverse system identification in a classical sense is not feasible for the calibration process. To overcome this issue, the stage outputs of the pipelined ADC are used for calibration instead of the final output signal 57. From FIG. 2, one skilled in the art will appreciate that the discontinuities in the transfer function can be corrected by adding appropriate offsets to the stage output levels. These offsets serve as parameters to be identified (e.g., estimated) by the calibration process and are summarized in a parameter vector $\theta$. In particular, denoted the uncalibrated output signal 57 of the pipelined ADC 50 as $y_x$, then a calibrated output signal $y_x^c$ (also referred to as a corrected output signal) can be obtained by $$y_x^c = y_x + h_x^T \theta, \quad (1)$$

where T represents the transpose operation, $h_x$ is a selection vector that selects the entries (e.g., components) of the parameter vector $\theta$ that correspond to the particular stage output levels of the pipelined ADC. To do so, the corresponding entries of the selection vector $h_x$ are set to 1 and 0 for active and inactive output levels, respectively. An example is given below to illustrate the discussion above.

Consider an example where each stage 51 of the pipelined ADC 50 has a 3-bit ADC 13, and the calibration process is performed using the stage outputs from the first two stages 51_1 and 51_2 of the pipelined ADC 50. Let p denote the number of stage output levels for all of the stages being considered in the calibration process, then storing all offsets for all output levels would require a parameter vector $\theta$ of length p. In this example, there are eight (e.g., $2^3=8$) possible different levels for the stage output of each stage 51, so that for the first two stages considered in the calibration process, the parameter vector $\theta$ may be written as a vector with size 16×1, e.g., $\theta = [\theta_{1,1}, \theta_{1,2}, \ldots, \theta_{1,8}, \theta_{2,1}, \theta_{2,2}, \ldots, \theta_{2,8}]^T$, where $\theta_{i,l}$ is the l-th offset values for the i-th stage, i=1 or 2, and l=1, 2, ..., or 8. The offset values $\theta_{i,l}$ are used to correct the nonlinearity of the pipelined ADC caused by, e.g., DAC errors. The values for the entries (e.g., components) of the selection vector $h_x$ are determined by the value of the stage output. For example, if the value of the stage output of the i-th stage is m (m=0, 1, 2, ..., or 7), then the entry $\theta_{i,m+1}$ of the parameter vector $\theta$ is selected, e.g., by setting the corresponding entries of the selection vector $h_x$ to 1. For example, if the stage outputs of the first stage 51_1 and the second stage 51_2 are binary code 000 and 000 respectively, the selection vector $h_x = [1\ 0\ 0\ 0\ 0\ 0\ 0\ 1\ 0\ 0\ 0\ 0\ 0\ 0\ 0]^T$. As another example, if the stage outputs of the first stage 51_1 and the second stage 51_2 are binary code 001 and 111 respectively, the selection vector $h_x = [0\ 1\ 0\ 0\ 0\ 0\ 0\ 0\ 0\ 0\ 0\ 0\ 0\ 0\ 0\ 1]^T$. As another example, if the stage outputs of the first stage 51_1 and the second stage 51_2 are binary code 111 and 001 respectively, the selection vector $h_x = [0\ 0\ 0\ 0\ 0\ 0\ 0\ 1\ 0\ 1\ 0\ 0\ 0\ 0\ 0\ 0]^T$. As yet another example, if the stage outputs of the first stage 51_1 and the second stage 51_2 are binary code 111 and 111 respectively, the selection vector $h_x = [0\ 0\ 0\ 0\ 0\ 0\ 0\ 1\ 0\ 0\ 0\ 0\ 0\ 0\ 0\ 1]^T$. In some embodiments, there exists some dependencies between the offsets of consecutive stages in that one parameter in the i-th stage can be represented by an offset in all parameters in the (i+1)-th stage. Eliminating these dependencies by excluding the redundant entries of the parameter vector $\theta$ may results in a parameter vector of length p-(q-1), with q denoting the number of stages considered for calibration. The reduced size of the parameter vector θ may advantageously reduce the computation complexity. In addition, the parameter vector θ with reduced size may guarantee a unique solution for the adaptive algorithm to estimate the parameter vector θ, thereby improving convergence of the adaptive algorithm.

Note that applying the post-correction operation of equation (1) equalizes the ADC by removing (e.g., correcting) the discontinuity in the transfer function, thus improving or achieving linearity of the pipelined ADC. After the post-correction operation of equation (1), an overall gain error in the transfer function may still remain. This gain error, however, does not affect the linearity of the pipelined ADC, and may be corrected in an additional processing step. The additional processing step to correct the gain error is outside the scope of the present disclosure, thus not discussed here.

Various methods for adaptively estimating or updating the parameter vector θ in a calibration process are discussed hereinafter. These adaptively estimation methods are referred to as homogeneity-enforced calibration (HEC) methods, since these HEC methods (also referred to as HEC approaches, HEC techniques, or HEC algorithms) are derived based on minimizing a cost function related to the homogeneity condition of the pipelined ADC. Details are discussed below.

Since the pipelined ADC 50 under calibration is nonlinear, it violates the linearity conditions. Specifically, a nonlinear system f(x): R→R does not satisfy the homogeneity condition $$f(\alpha x) = \alpha f(x) \quad (2)$$

and/or the additivity condition $$f(x_a + x_b) = f(x_a) + f(x_b) \quad (3)$$

where x, $x_a$, $x_b$ are the system inputs, and a is a constant (α∈R). The HEC calibration technique disclosed herein is based on the homogeneity condition. The calibration is performed by injecting a test signal twice into the pipelined ADC 50, whereas for the second time, the test signal is scaled by a constant factor α. By scaling the test signal with the constant factor α, the HEC approach obviates the need for a highly constant and/or linear voltage signal generated by a highly accurate test signal generator. The scaling of the test signal can be easily implemented using a voltage divider. Details of the HEC approach are discussed below with reference to FIG. 3.

Figure 3:
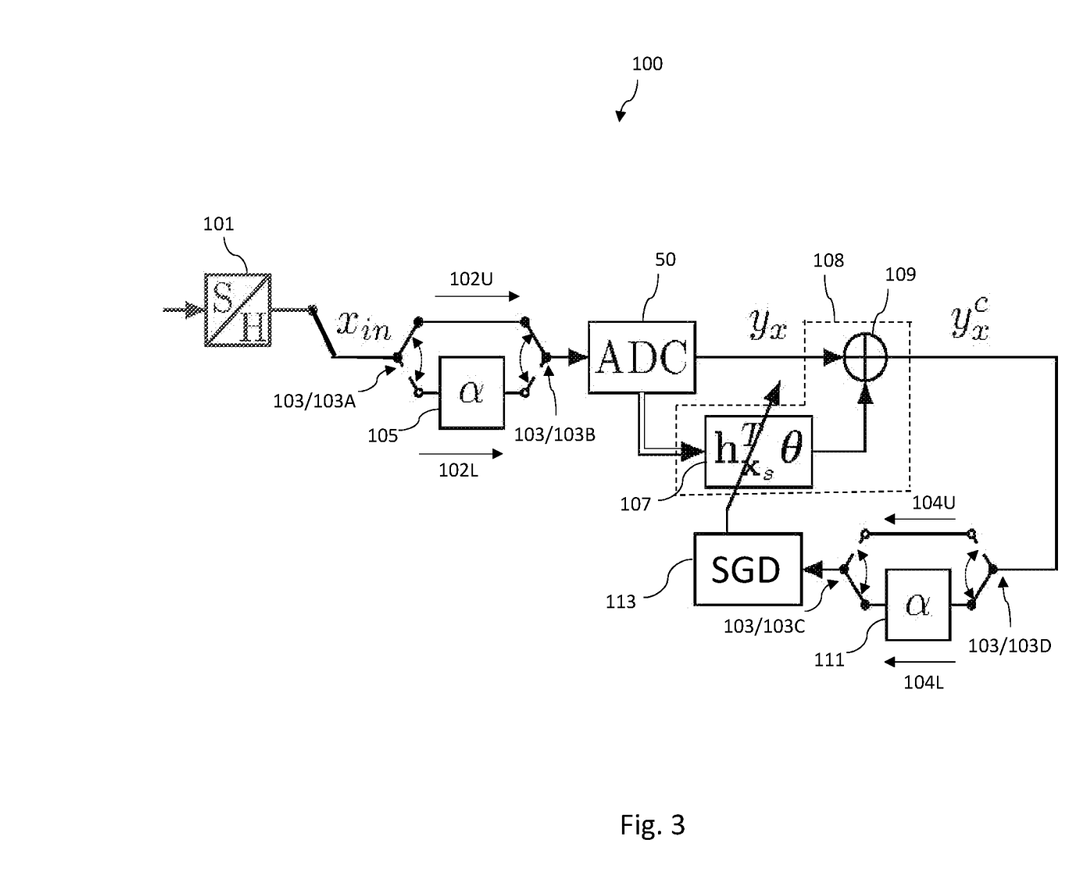
FIG. 3 illustrates a block diagram of a pipelined ADC system with built-in calibration capability, in an embodiment.

FIG. 3 illustrates a block diagram of a pipelined ADC system 100 with built-in calibration capability, in an embodiment. The pipelined ADC system 100 includes a sample-and-hold (S/H) circuit 101, a pipelined ADC 50, and signal paths 102U/102L between the S/H circuit 101 and the pipelined ADC 50. The signal path 102U is a directly path (e.g., copper line), while the signal path 102L comprises a scaling circuit 105 (e.g., a voltage divider) with a constant scale factor α. A selection circuit 103A is coupled between the S/H circuit 101 and the signal paths 102U/102L, and a selection circuit 103B is coupled between the pipelined ADC 50 and the signal paths 102U/102L. The selection circuits 103A and 103B may be, e.g., single pole double throw (SPDT) switches controlled by a control signal. For ease of discussion, the selection circuits 103A and 103B (and 103C and 103D discussed below) may also be referred to as switches.

Depending on the control signal for the switches 103A and 103B, the switches 103A and 103B may couple the output of the S/H circuit 101 directly to the input of the pipelined ADC 50 via the signal path 102U, or may couple the output of the S/H circuit 101 to the input of the pipelined ADC 50 via the signal path 102L, in which case the output of the S/H circuit 101 is scaled by the scale factor α, and the scaled signal is sent to the input of the pipelined ADC 50.

The pipelined ADC system 100 further includes a correction circuit 108 which includes an adder 109 and a correction term calculator 107. For each output $y_x$ of the pipelined ADC 50, the correction term calculator 107 determines the selection vector $h_x$ based on the stage outputs of the output stages (e.g., 51_1, 51_2) considered for the calibration process. For ease of discussion, the output stages considered for the calibration process may also be referred to as output stages under calibration. In addition, the correction term calculator 107 computes a correction term $h_x^T \theta$, which is added to the output $y_x$ of the pipelined ADC 50 by the adder 109 to generate the calibrated output $y_x^c$ of the pipelined ADC 50, which is also the output of the pipelined ADC system 100.

Still referring to FIG. 3, the pipelined ADC system 100 further includes a parameter vector update circuit 113, and signal paths 104U and 104L between the output of the adder 109 and the parameter vector update circuit 113. The signal path 104U is a direct path (e.g., copper line), and the signal path 104L includes a multiplier 111 having a scale factor α (also referred to as gain factor). A selection circuit 103C (e.g., a SPDT switch) is coupled between the parameter vector update circuit 113 and the signal paths 104U/104L, and a selection circuit 103D (e.g., a SPDT switch) is coupled between the adder 109 and the signal paths 104U/104L. The switches 103C and 103D are controlled such that when the output of the S/H circuit 101 is sent directly (e.g., via signal path 102U) to the pipelined ADC 50, the output of the adder 109 is sent via the signal path 104L (e.g., after being scaled by the scale factor α) to the parameter vector update circuit 113; and when the output of the S/H circuit 101 is sent via the signal path 102L (e.g., after being scaled by the scale factor α) to the pipelined ADC 50, the output of the adder 109 is sent via the signal path 104U directly to the parameter vector update circuit 113. In other words, the signal paths 102U and 104L are selected together by the switches 103 (e.g., 103A, 103B, 103C, and 103D), and the signal paths 102L and 104U are selected together by the switches 103. The control signal for the switches 103 may be generated by, e.g., the parameter vector update circuit 113, or by a digital signal processing block (see, e.g., 217 in FIG. 6) coupled to the pipelined ADC 50. The parameter vector update circuit 113 updates the estimate of the parameter vector θ adaptively using each input signal to the pipelined ADC system 100, as described below. The parameter vector update circuit 113 may be or include a micro-controller, a digital signal processor (DSP), an application-specific integrated circuit (ASCI), or the like.

In FIG. 3, the correction circuit 108, the multiplier 111, the switches 103C/103D, and the parameter vector update circuit 113 are illustrated as separate circuits/components. This is merely a non-limiting example. In some embodiments, some, of all of the correction circuit 108, the multiplier 111, the switches 103C/103D, and the parameter vector update circuit 113 are implemented as a single circuit, such as a micro-controller. These and other variations are fully intended to be included within the scope of the present disclosure.

In an embodiment, to update the estimate of the parameter vector θ adaptively using each analog input signal sent to the pipelined ADC system 100, the analog input signal is held (e.g., stored) by the S/H circuit 101. Denote the output of the S/H circuit 101 as $x_{in}[k]$, where k is the sample index. The pipelined ADC system 100 performs a two-step processing to update the estimate of the parameter vector θ. In the first step of processing, the switches 103 select the signal paths 102U and 104L, such that the stored analog input signal is converted into a first digital output $y_x[k]$ by the pipelined DC 50. The correction circuit 108 adds a correction term to the first digital output $y_x[k]$ to generate a first corrected output signal $y_x[k]+h_x^T[k]\theta[k-1]$, where $h_x[k]$ is the selection vector corresponding to (e.g., determined by) the stage outputs of the output stages under calibration for the input signal $x_{in}[k]$, and $\theta[k-1]$ is the current available estimate of the parameter vector θ obtained using the previous input signal $x_{in}[k-1]$ (e.g., after the previous input signal $x_{in}[k-1]$ is used to update the parameter vector θ). The first corrected output signal is scaled by the multiplier 111 by a scale factor α. The scaled corrected output signal $\alpha(y_x[k]+h_x^T[k]\theta[k-1])$ is sent to the parameter vector update circuit 113, and will be used to update the parameter vector θ.

Next, in the second step of processing, the switches 103 selects the signal paths 102L and 104U, such that a scaled version of the input signal $x_{in}[k]$, scaled by the scale factor α, is sent to the pipelined ADC 50 and converted into a second digital signal $y_{\alpha x}[k]$. The correction circuit 108 adds a correction term to the second digital output $y_{\alpha x}[k]$ to generate a second corrected output signal $y_{\alpha x}[k]+h_{\alpha x}^T[k]\theta[k-1]$, where $h_{\alpha x}[k]$ is the selection vector corresponding to the stage outputs of the output stages under calibration for the scaled input signal $\alpha x_{in}[k]$. The second corrected output signal is then sent to the parameter vector update circuit 113.

When the parameter vector θ is not fully adapted, the second corrected output signal $y_{\alpha x}[k]+h_{\alpha x}^T[k]\theta[k-1]$ is not equal to the scaled corrected output signal $\alpha(y_x[k]+h_x^T[k]\theta[k-1])$. In other words, the not fully calibrated pipelined ADC 50 does not satisfy the homogeneity condition, and the following inequality exits:

$$y_{\alpha x}[k]+h_{\alpha x}^T[k]\theta[k-1] \neq \alpha(y_x[k]+h_x^T[k]\theta[k-1]) \quad (4)$$

The HEC algorithm defines a cost function J(θ) as:

$$J(\theta)=\{y_{\alpha x}[k]+h_{\alpha x}^T[k]\theta[k-1]-\alpha(y_x[k]+h_x^T[k]\theta[k-1])\}^2 \quad (5)$$

and tries to find an estimate of the parameter vector θ that minimizes the cost function J(θ). Any suitable estimation algorithm may be used to update the estimate of the parameter vector θ. For example, a stochastic gradient descent (SGD) algorithm may be used to adaptively find the optimum or near-optimum solution of the parameter vector θ. The partial derivative (also referred to as gradient) of the cost function J(θ) with respect to the parameter vector θ can be written as $$\frac{\partial J(\theta)}{\partial \theta} = \quad (6)$$
$$2[y_{\alpha x}[k]+h_{\alpha x}^T[k]\theta[k-1]-\alpha(y_x[k]+h_x^T[k]\theta[k-1])](h_{\alpha x}[k]-\alpha h_x[k])$$

Define:

$$\Delta y[k]=y_{\alpha x}[k]-\alpha y_x[k] \quad (7)$$

$$\Delta h[k]=h_{\alpha x}[k]-\alpha h_x[k] \quad (8)$$

$$e[k]=y_{\alpha x}[k]+h_{\alpha x}^T[k]\theta[k-1]-\alpha(y_x[k]+h_x^T[k]\theta[k-1])=\Delta y[k]+\Delta h[k]^T\theta[k-1] \quad (9)$$

The partial derivative of equation (6) can be rewritten as:

$$\frac{\partial J(\theta)}{\partial \theta} = 2e[k]\Delta h[k] \quad (10)$$

Using the gradient of the parameter vector θ to update the estimate of the parameter vector θ in the SGD algorithm yields:

$$\theta[k]=\theta[k-1]-2\mu e[k]\Delta h[k] \quad (11)$$

Or equivalently:

$$\theta[k]=\theta[k-1]-2\mu(\Delta y[k]+\Delta h[k]^T\theta[k-1])\Delta h[k] \quad (12)$$

where μ is the step size used in the update equation. Therefore, starting from an initial estimate of the parameter vector θ, the adaptative processing of equation (11) or (12) can be performed by the parameter vector update circuit 113 for each incoming signal to the pipelined ADC system 100 to adaptively update the estimate of the parameter vector θ. In some embodiments, an all-zero vector is used as the initial value of the parameter vector θ (e.g., θ=0). In some embodiments, if a previous calibration process was performed, then the last known good estimate of the parameter vector θ may be used as the initial value of the parameter vector θ for a new calibration process performed after the previous calibration process.

Note that the computations to update the parameter vector θ do not need to be performed for each input signal, especially if the non-linear characteristics of the pipelined ADC 50 is changing slowly. Instead, the parameter vector θ may be updated for every two, three, or N (N>1) input signals. This advantageously reduces the computational load and hardware cost of the pipelined ADC system 100.

The HEC algorithm described above does not need a prior information of the input analog signal to the pipelined ADC system 100. In other words, the input analog signal can be an unknown signal to the pipelined ADC system 100. Therefore, the HEC algorithm described above may also be referred to as a blind estimation algorithm. The blind estimation algorithm (e.g., the HEC algorithm) allows the pipelined ADC system 100 to operate in a hybrid calibration-conversion mode, where the pipelined ADC system 100 operates to convert the input analog signal into a digital output $y_x^c$ (e.g., corrected output signal) for processing by subsequent digital signal processing blocks, while at the same time, uses the input analog signal in the blind estimation algorithm to update the estimate of the parameter vector θ. This is different from ADC systems where calibratoin mode and normal operation mode are performed separately, where in calibration mode, the ADC system is calibrated and no digital output is generated for processing by subsequent processing blocks, and in normal operation mode, no calibration is performed and the ADC system converts input signal into digital output for processing.

Note that during each update of the parameter vector θ, only entries of the parameter vector θ corresponding to non-zero entries of the vector Δh[k] in equation (8) get updated. Therefore, if a random, uncontrolled input signal is used as the calibration input signal to the pipelined ADC system 100, it may take a long time for all entries of the parameter vector θ to get updated and converge to the optimum or near-optimum values, in which case the HEC approach is suitable for calibrating pipelined ADC with static or slow-changing nonlinearity instead of a fast-changing nonlinearity. On the other hand, if a controlled input signal, such as an input signal generated by a signal generator, which sweeps across the full input range of the pipelined ADC 50 is used in the calibration process, then the HEC approach can quickly converge to the optimum or near-optimum values.

Figure 4:
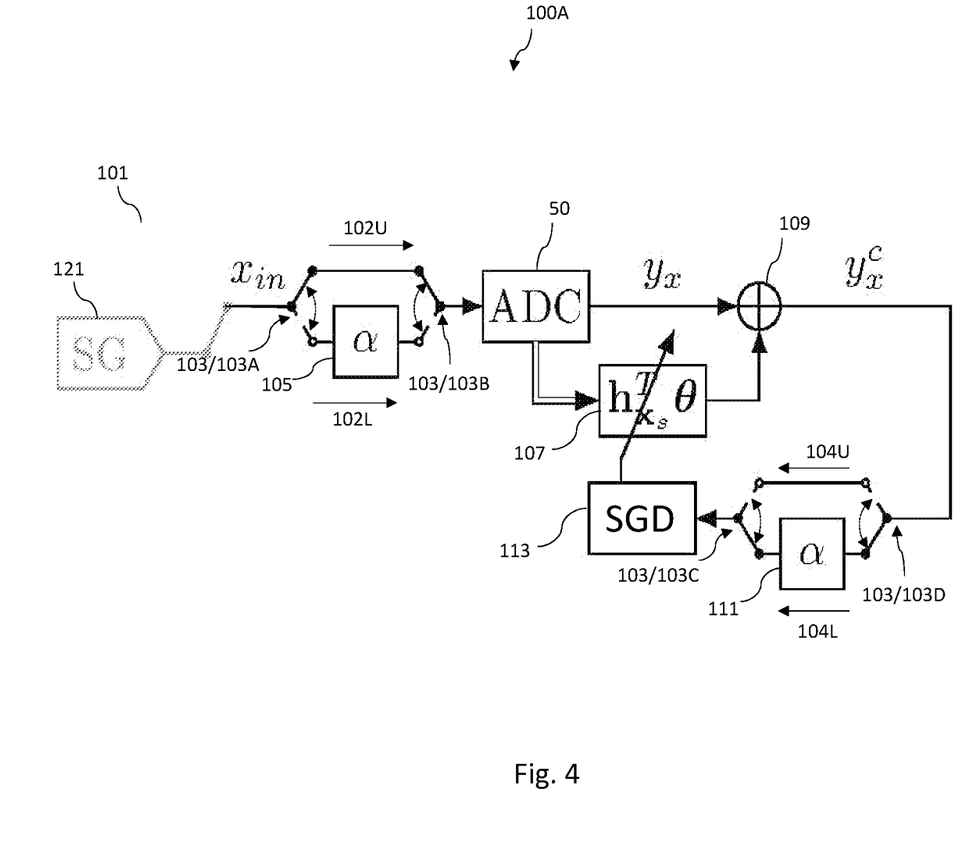
FIG. 4 illustrates a block diagram of a pipelined ADC system with built-in calibration capability, in another embodiment.

FIG. 4 illustrates a block diagram of a pipelined ADC system 100A with built-in calibration capability, in another embodiment. The pipelined ADC system 100A is similar to the pipelined ADC system 100 of FIG. 3, but with the S/H circuit 101 replaced by a signal generator 121. In some embodiments, the signal generator 121 generates a series of input signals with amplitudes spanning the full input range of the pipelined ADC 50 to achieve quick convergence and obtain an estimate of the parameter vector θ. The series of input signals may form a ramp signal that increases from zero to the full input range of the pipelined ADC 50, for example. Since no S/H circuit is used in the embodiment of FIG. 4, the signal generator 121 sends each input signal twice to the pipelined ADC 50, with the paths 102U and 104L selected for the first time, and the paths 102L and 104U selected for the second time, as an example. Details are similar to those discussed above for the pipelined ADC system 100 of FIG. 3, thus not repeated here. Note that since the input signal does not need to be known for the HEC approach to work, the signal generator 121 does not have to be a highly accurate and expensive signal generator, and linearity requirement for the signal generator 121 can be greatly relaxed.

The pipelined ADC system 100A of FIG. 4 may be used to for calibrating the pipelined ADC 50 quickly to obtain an estimate of the parameter vector θ. After the calibration is finished, the pipelined ADC system 100A may enter a normal operation mode (also referred to as a conversion mode), where no calibration is performed and the parameter vector θ keeps the value obtained at the end of the calibration process, the pipelined ADC 50 converts each incoming signal into a digital data, and a corrected digital output is generated by adding a correction term to the digital data. The calibration process may be re-started again later, e.g., after a pre-determined period of time has elapsed, or when it is determined that the non-linear characteristics of the pipelined ADC 50 has drifted away from where it was during the last calibration.

Figure 5:
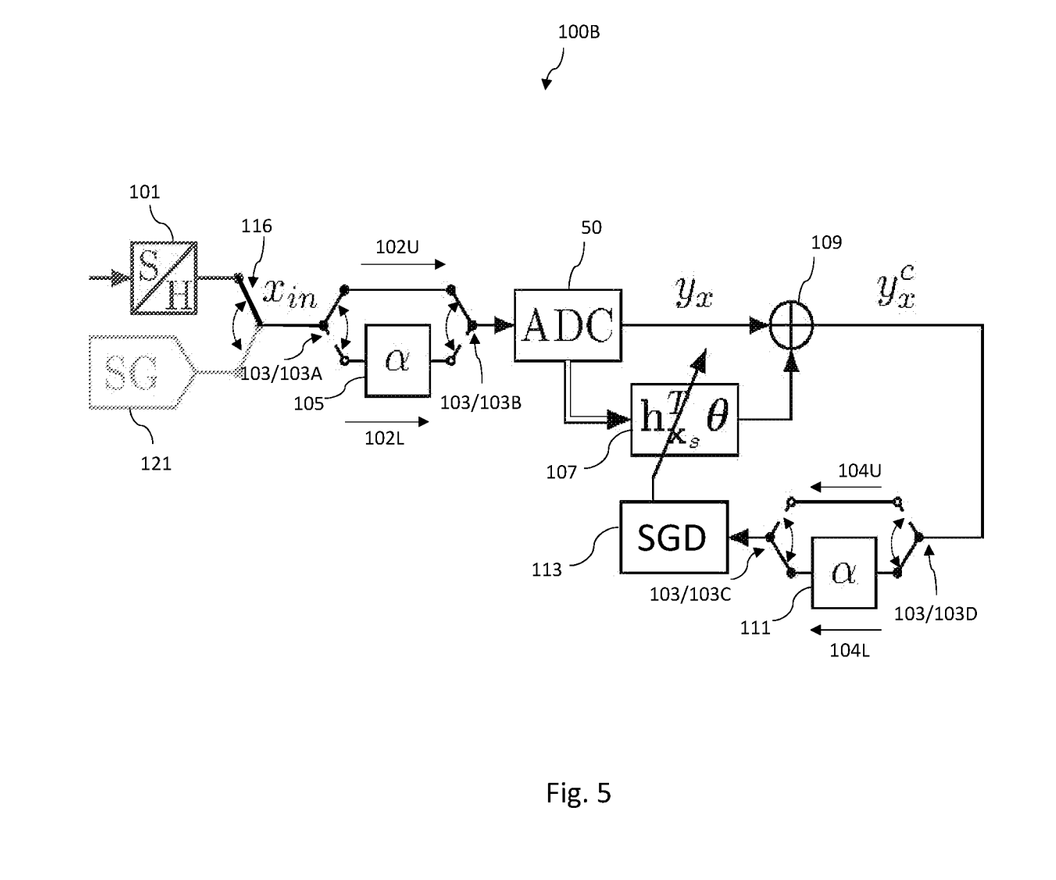
FIG. 5 illustrates a block diagram of a pipelined ADC system with built-in calibration capability, in yet another embodiment.

FIG. 5 illustrates a block diagram of a pipelined ADC system 100B with built-in calibration capability, in another embodiment. The pipelined ADC system 100B is similar to the pipelined ADC system 100 of FIG. 3, but having additional blocks such as a signal generator 121 and a selection circuit 116 (e.g., a SPDT switch). The pipelined ADC system 100B may be considered as a combination of the pipelined ADC system 100 and the pipelined ADC system 100A. In some embodiments, after a start-up (e.g., after being powered on) or a reset of the pipelined ADC system 100B, the control signal for the selection circuit 116 selects the signal generator 121, which generates input signals (e.g., a ramp signal) to quickly calibrate the pipelined ADC 50 and obtain an estimate of the parameter vector θ. After the calibration process is completed, the control signal for the selection circuit 116 selects the S/H circuit 101, and the pipelined ADC system 100B works in the hybrid calibration-conversion mode to track slow changing nonlinearity of the pipelined ADC 50 and to convert the input signal and generate corrected output data. Details are the same as or similar to those discussed above, thus not repeated.

The error term e[k] in equation (9) may be used as a figure of merit for evaluating the nonlinearity (e.g., deviation from the homogeneity condition) of the pipelined ADC systems 100, 100A, or 100B. For example, after an initial calibration process (e.g., a blind calibration process using unknown input signal, or a calibration process using input signal generated by a signal generator), the error term e[k] may be calculated for incoming input signals and compared with a pre-determined threshold. If the error term e[k] is larger than the pre-determined threshold, a flag (e.g., a warning signal) may be set by the pipelined ADC system to indicate that the nonlinearity has passed a target level. In response to the flag being set, the pipelined ADC system may start a new calibration process, e.g., using signals generated by the signal generator 121 to quickly update the estimation vector θ.

It should be mentioned that the HEC calibration method discussed above assumes that the scale factor α of the scaling circuit 105 matches the scale factor α of the multiplier 111. In practice however, this match may not be guaranteed due to process and temperature variations, e.g., the scale factor α of the scaling circuit 105 may deviate from its nominal value. Consequently, the performance of the HEC calibration technique may be limited by a potential mismatch between the scale factor α of the scaling circuit 105 (also referred to as the analog scale factor α) and the scale factor α of the amplifier in (also referred to as the digital scale factor α). To overcome this mismatch issue, an extension of the HEC calibration method is presented below. This extension method estimates the value of the analog scale factor α in addition to the parameter vector θ, and the estimated value of the analog scale factor α is used as the digital scale factor α in the updating equations. Specifically, the original cost-function in equation (5) is rewritten as $$J[k]=(y_{60_a x}^T[k]\theta_{NL}-\theta_\alpha(y_x[k]+h_x^T[k]\theta_{NL}))^2 \qquad (13)$$

In the equation above, the analog scaling factor is denoted as $\alpha_a$, and the digital scaling factor α is replaced by an additional parameter $\theta_\alpha$ to be estimated. For better readability, the original parameter vector θ is replaced by $\theta_{NL}$, which indicates that this vector only covers the pipelined ADC nonlinearity (e.g., the parameter vector θ). In order to derive the corresponding parameter update equation, the cost-function of equation (13) is differentiated with respect to the joint parameter vector $$\theta_J^T=[\theta_\alpha^T \theta_{NL}^T] \qquad (14)$$

Specifically, the gradient may be written as $$\left(\partial_{\theta_J} J[k]\right)^T = \begin{bmatrix} -2e[k](y_x[k]+h_x^T[k]\theta_{NL}) \\ 2e[k](h_{\alpha_a x}[k]-\theta_\alpha h_x[k]) \end{bmatrix} \qquad (15)$$

with the error term computed as $$e[k]=y_{\alpha_a x}[k]+h_{\alpha_a x}^T[k]\theta_{NL}[k-1]-\alpha_\alpha[k-1](y_x[k]+h_x^T[k]\theta_{NL}[k-1]) \qquad (16)$$

Utilizing this gradient to update the joint parameter vector adaptively yields the update equations $$\theta_\alpha[k]=\theta_\alpha[k-1]-2\mu_\alpha e[k](y_x[k]+h_x^T[k]\theta_{NL}[k-1]) \qquad (17)$$

and $$\theta_{NL}[k]=\theta_{NL}[k-1]-2\mu_{NL}e[k](h_{\alpha_a}[k]-\theta_\alpha[k-1]h_x[k]) \qquad (18)$$

The $\mu_\alpha$ in equation (17) and $\mu_{NL}$ in equation (18) are the step sizes used in the updating equations. As can be seen, the update equation for $\theta_{NL}$ in equation (18) is similar to the one in equation (11) or (12) except for the replacement of α with the previous estimate of α (e.g., $\theta_\alpha[k-1]$). Additionally, a second update equation (17) is used to adapt the $\theta_\alpha$. Note that the update of $\theta_\alpha$ in equation (17) barely add any computational load, since $e[k]$ and $y_x[k]+h_x^T[k]\theta_{NL}[k-1]$ are needed in equation (18) for the computation of $\theta_{NL}[k]$. Note further that both update equations (17) and (18) are coupled in a nonlinear manner. This is because the error $e[k]$ is bilinear with respect to its parameters.

Figure 6:
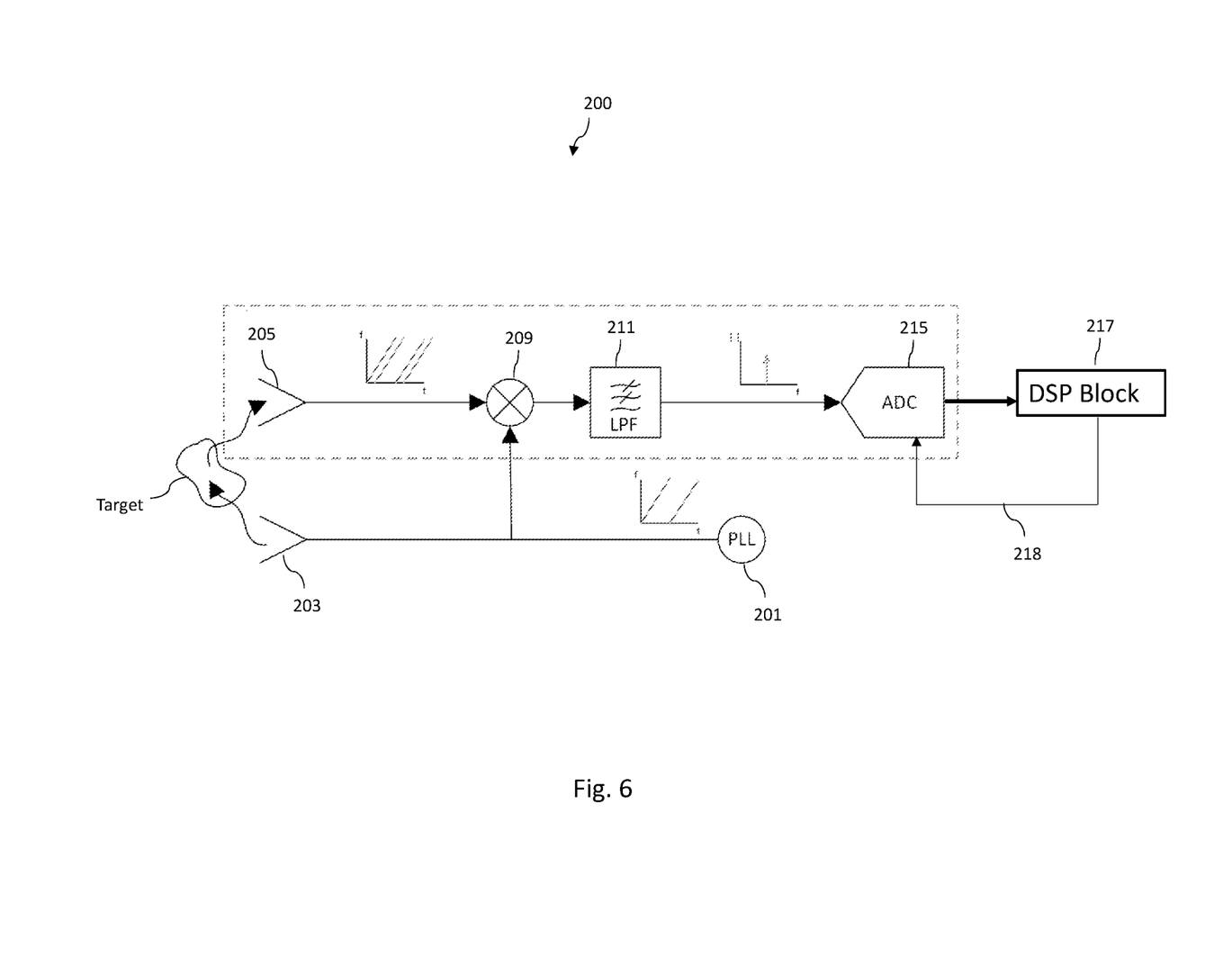
FIG. 6 illustrates a radar system with a pipelined ADC system, in an embodiment.

FIG. 6 illustrates a radar system 200 with a pipelined ADC system 215, in an embodiment. In the example of FIG. 6, the radar system 200 is a frequency-modulated continuous-wave (FMCW) radar system. The pipelined ADC system 215 may be any of the pipelined ADC systems (e.g., 100, 100A, 100B) discussed above.

In the example of FIG. 6, the FMCW radar system includes a radio frequency (RF) circuit 201 (e.g., a phase-locked loop circuit) that generates an RF signal (e.g., a chirp signal), which is transmitted using one or more transmit (Tx) antennas 203. The transmitted RF signal bounces back from a target, and is received by one or more receive (Rx) antennas 205. In FMCW radar systems, the frequency difference between the received RF signal and the transmitted RF signal increases proportionally with the time delay between the transmitted and received RF signals. Therefore, the distance between the FMCW radar system and the target can be determined by finding the frequency difference between the transmitted and received RF signals.

Still referring to FIG. 6, the received RF signal is mixed with a reference signal (e.g., from the RF circuit 201) by a mixer 209. The output of the mixer 209 is filtered by a filter 211 (e.g., a lower pass filter or a bandpass filter). The output of the filter 211 is then converted to digital data by the pipelined ADC system 215. The output of the pipelined ADC system 215, which are corrected digital output, are sent to a digital signal processing (DSP) circuit 217 for processing (e.g., target detection). The DSP circuit 217 may be or include a micro-controller, a digital signal processor, an ASIC, or the like. The DSP circuit 217 may generate control signals for controlling, e.g., the selection circuits 103 and/or the selection circuit 116 of the pipelined ADC system (e.g., 100A, 100B, 100C, 215). The DSP circuit 217 may also control (e.g., set) the operation mode of the pipelined ADC system 215.

The radar system 200 may be used in various applications, such as automobile applications for self-driving or driving assistance related functions. The nonlinearity of the pipelined ADC system 215, if left uncalibrated, may result in performance degradation and may cause, e.g., false target or missed target. For applications with stringent safety and performance requirements, such as automobile applications, the presently disclosed pipelined ADC systems (e.g., 100, 100A, or 100B) with self-calibration capability are highly desirable.

Figure 7:
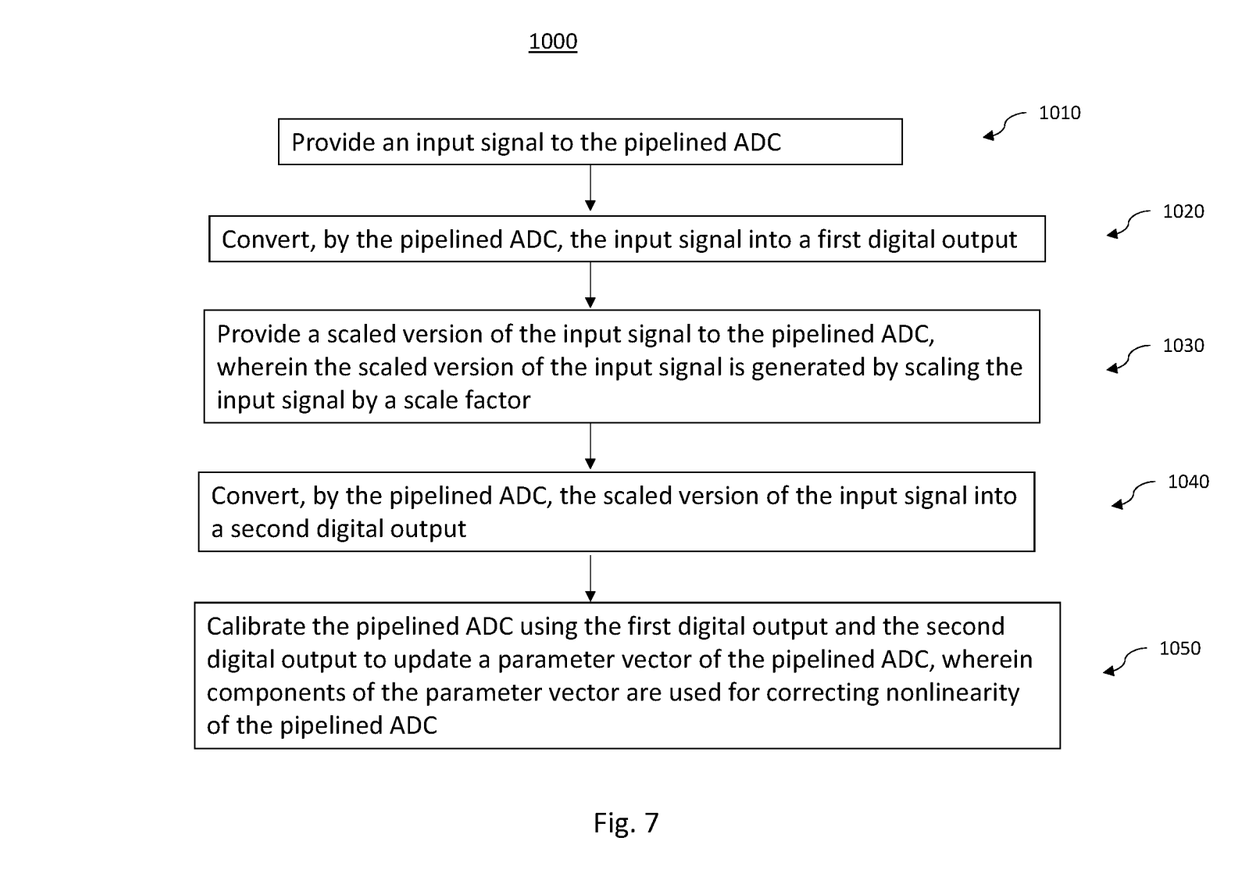
FIG. 7 illustrates a flow chart of a method of operating a pipelined ADC, in some embodiments.

FIG. 7 illustrates a flow chart of a method 1000 of calibrating a pipelined ADC having a plurality of output stages, in accordance with some embodiments. It should be understood that the example method shown in FIG. 7 is merely an example of many possible example methods. One of ordinary skill in the art would recognize many variations, alternatives, and modifications. For example, various steps as illustrated in FIG. 7 may be added, removed, replaced, rearranged, or repeated.

Referring to FIG. 7, at block 1010, an input signal is provided to the pipelined ADC. At block 1020, the pipelined ADC converts the input signal into a first digital output. At block 1030, a scaled version of the input signal is provided to the pipelined ADC, wherein the scaled version of the input signal is generated by scaling the input signal by a scale factor. At block 1040, the pipelined ADC converts the scaled version of the input signal into a second digital output. At block 1050, the pipelined ADC is calibrated using the first digital output and the second digital output to update a parameter vector of the pipelined ADC, wherein components of the parameter vector are used for correcting nonlinearity of the pipelined ADC.

Embodiments may achieve advantages. For example, the disclosed HEC calibration method can use unknown signals to calibrate (e.g., estimate) the parameter vector $\theta$ of a pipelined ADC. As a result, the calibration process can be performed without using a highly accurate signal generator, and is well suited for on-demand calibration for devices deployed in the field. Pipelined ADC systems with the disclosed self-calibration capability can produce calibrated (e.g., corrected) digital outputs using the estimated parameter vector $\theta$, thus achieving improved system performed. The disclosed HEC calibration method is performed in digital domain, allowing for simple and cost-effective solution. A hybrid calibration-conversion mode is supported by the HEC calibration method, which allows calibration of the ADC system and conversion of input signal into calibrated output data to be performed simultaneously. In addition, the error term $e[k]$ in equation (9) provides a figure of merit for monitoring the nonlinearity of the ADC system.

Examples of the present invention are summarized here. Other examples can also be understood from the entirety of the specification and the claims filed herein.

Example 1. In an embodiment, a method of operating a pipelined analog-to-digital converter (ADC) having a plurality of output stages includes: performing a first calibration process for the pipelined ADC to update a parameter vector of the pipelined ADC, wherein components of the parameter vector are used for correcting nonlinearity of the pipelined ADC, wherein performing the first calibration process comprises: providing an input signal to the pipelined ADC; converting, by the pipelined ADC, the input signal into a first digital output; providing a scaled version of the input signal to the pipelined ADC, wherein the scaled version of the input signal is generated by scaling the input signal by a scale factor; converting, by the pipelined ADC, the scaled version of the input signal into a second digital output; and calibrating the pipelined ADC using the first digital output and the second digital output.

Example 2. The method of Example 1, further comprising varying an amplitude of the input signal across a full input range of the pipelined ADC.

Example 3. The method of Example 1, wherein the first calibration process is performed in a hybrid calibration-conversion operation mode of the pipelined ADC, wherein in the hybrid calibration-conversion operation mode, the first calibration process is performed to update the parameter vector using the input signal to the pipelined ADC while a calibrated ADC output is generated for the input signal.

Example 4. The method of Example 1, further comprising: storing, by a sample-and-hold (S/H) circuit, the input signal to the pipelined ADC, wherein providing the input signal to the pipelined ADC comprises sending the stored input signal to the pipelined ADC, and wherein providing the scaled version of the input signal to the pipelined ADC comprises: scaling the stored input signal by the scale factor to generate a scaled input signal; and sending the scaled input signal to the pipelined ADC.

Example 5. The method of Example 1, wherein the first calibration process is performed without a priori information of the input signal to the pipelined ADC.

Example 6. The method of Example 1, wherein the components of the parameter vector comprise estimated values of offsets of the pipelined ADC from a target linear response of the pipelined ADC, wherein each of the offsets corresponds to a respective value of a stage output of the pipelined ADC.

Example 7. The method of Example 1, further comprising: determining a first selection vector based on first outputs of first output stages of the plurality of output stages, wherein the first outputs are generated by the first output stages when the input signal is being converted by the pipelined ADC; and determining a second selection vector based on second outputs of the first output stages, wherein the second outputs are generated by the first output stages when the scaled version of the input signal is being converted by the pipelined ADC, wherein calibrating the pipelined ADC comprises calibrating the pipelined ADC using the first digital output, the second digital output, the first selection vector, and the second selection vector.

Example 8. The method of Example 7, wherein each component of the first selection vector has a value of zero or one, and is determined by the first outputs of the first output stages, wherein each component of the second selection vector has a value of zero or one, and is determined by the second outputs of the first output stages.

Example 9. The method of Example 8, wherein updating the parameter vector comprises: computing a first corrected digital output by adding the first digital output with a product of a transpose of the first selection vector and the parameter vector; computing a second corrected digital output by adding the second digital output with a product of a transpose of the second selection vector and the parameter vector; computing a first difference between the second corrected digital output and a product of a digital scale factor and the first corrected digital output, wherein the digital scale factor is an estimate of the scale factor; computing a first vector by subtracting a product of the first selection vector and the digital scale factor from the second selection vector; and updating the parameter vector by subtracting a product of the first vector, the first difference, and a first step size from the parameter vector.

Example 10. The method of Example 9, further comprises updating the digital scale factor using the first digital output, the second digital output, the first selection vector, and the second selection vector.

Example 11. The method of Example 10, wherein updating the digital scale factor comprises updating the digital scale factor by adding a product of the first difference, the first corrected digital output, and a second step size to the digital scale factor.

Example 12. The method of Example 2, further comprising: stopping the first calibration process, wherein after the first calibration process is stopped, update of the parameter vector is stopped, and the components of the parameter vector retain values achieved at the end of the first calibration process; and operating the pipeline ADC in a normal operation mode, comprising: converting an input analog signal of the pipelined ADC into a digital output; and generating a calibrated ADC output by adding a correction term to the digital output, wherein the correction term is determined based on the parameter vector and at least one stage output of an output stage of the plurality of output stages.

Example 13. The method of Example 3, further comprising: after a start-up or a reset of the pipelined ADC, performing a second calibration process using a signal source generated by a signal generator that sweeps across a full input range of the pipelined ADC, wherein the second calibration process performs the same processing as the first calibration process but replaces the input signal with the signal source and replaces the scaled version of the input signal with a scaled version of the signal source; and after the second calibration process is completed, operating the pipelined ADC in the hybrid calibration-conversion operation mode.

Example 14. The method of Example 8, wherein updating the parameter vector comprises: computing a first scalar by subtracting a product of the first digital output and the scale factor from the second digital output; computing a first vector by subtracting a product of the first selection vector and the scale factor from the second selection vector; computing a second scalar by adding the first scalar and a product of a transpose of the first vector and the parameter vector; computing a second vector by multiplying the first vector with the second scalar and a step size; and updating the parameter vector by subtracting the second vector from the parameter vector.

Example 15. The method of Example 14, further comprising computing a first calibrated output for the input signal by adding a product of a transpose of the first selection vector and the parameter vector to the first digital output.

Example 16. In an embodiment, an analog-to-digital converter system includes: an input terminal configured to receive an input signal; a pipelined analog-to-digital converter (ADC); a first path between the input terminal and the pipelined ADC, wherein when selected, the first path couples the input terminal to the pipelined ADC; a second path between the input terminal and the pipelined ADC, wherein the second path comprises a scaling circuit configured to scale a signal by a scale factor, wherein when selected, the second path sends a scaled version of the input signal to the pipelined ADC; selection circuits configured to select the first path or the second path based on a control signal of the analog-to-digital converter system; and a correction circuit configured to generate a first corrected output for the pipelined ADC based on a first digital output of the pipelined ADC, wherein the first digital output is an output of the pipelined ADC when the first path is selected.

Example 17. The analog-to-digital converter system of Example 16, wherein the correction circuit is configured to generate the first corrected output by adding a product of a transpose of a first selection vector and a parameter vector to the first digital output, wherein the parameter vector comprises components for correcting non-linear characteristics of the pipelined ADC, and the first selection vector selects corresponding components of the parameter vector based on stage outputs of first output stages of the pipelined ADC when the input signal is being converted by the pipelined ADC.

Example 18. The analog-to-digital converter system of Example 17, further comprising a sample-and-hold (S/H) circuit coupled between the input terminal and the first and second paths, wherein the S/H circuit is configured to store the input signal.

Example 19. The analog-to-digital converter system of Example 18, wherein the analog-to-digital converter system is configured to update the parameter vector by: storing, by the S/H circuit, the input signal received at the input terminal; selecting the first path to send the input signal to the pipelined ADC; converting the input signal into the first digital output and determining the first selection vector corresponding to the input signal; selecting the second path to send the scaled version of the input signal to the pipeline ADC; converting the scaled version of the input signal into a second digital output and determining a second selection vector corresponding to the scaled version of the input signal; and updating the parameter vector using the first digital output, the second digital output, the first selection vector, and the second selection vector.

Example 20. The analog-to-digital converter system of Example 19, wherein updating the parameter vector comprises: computing a first corrected digital output by adding the first digital output with a product of a transpose of the first selection vector and the parameter vector; computing a second corrected digital output by adding the second digital output with a product of a transpose of the second selection vector and the parameter vector; computing a first difference between the second corrected digital output and a product of the scale factor and the first corrected digital output; computing a first vector by subtracting a product of the first selection vector and the scale factor from the second selection vector; and updating the parameter vector by subtracting a product of the first vector, the first difference, and a step size from the parameter vector.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A method of operating a pipelined analog-to-digital converter (ADC) having a plurality of output stages, the method comprising:
   performing a first calibration process for the pipelined ADC to update a parameter vector of the pipelined ADC, wherein components of the parameter vector are used for correcting nonlinearity of the pipelined ADC, wherein performing the first calibration process comprises:
      providing an input signal to the pipelined ADC;
      converting, by the pipelined ADC, the input signal into a first digital output;
      providing a scaled version of the input signal to the pipelined ADC, wherein the scaled version of the input signal is generated by scaling the input signal by a scale factor;
      converting, by the pipelined ADC, the scaled version of the input signal into a second digital output; and
      calibrating the pipelined ADC using the first digital output and the second digital output.

2. The method of claim 1, further comprising varying an amplitude of the input signal across a full input range of the pipelined ADC.

3. The method of claim 1, wherein the first calibration process is performed in a hybrid calibration-conversion operation mode of the pipelined ADC, wherein in the hybrid calibration-conversion operation mode, the first calibration process is performed to update the parameter vector using the input signal to the pipelined ADC while a calibrated ADC output is generated for the input signal.

4. The method of claim 1, further comprising:
   storing, by a sample-and-hold (S/H) circuit, the input signal to the pipelined ADC,
   wherein providing the input signal to the pipelined ADC comprises sending the stored input signal to the pipelined ADC, and
   wherein providing the scaled version of the input signal to the pipelined ADC comprises:
      scaling the stored input signal by the scale factor to generate a scaled input signal; and
      sending the scaled input signal to the pipelined ADC.

5. The method of claim 1, wherein the first calibration process is performed without a priori information of the input signal to the pipelined ADC.

6. The method of claim 1, wherein the components of the parameter vector comprise estimated values of offsets of the pipelined ADC from a target linear response of the pipelined ADC, wherein each of the offsets corresponds to a respective value of a stage output of the pipelined ADC.

7. The method of claim 1, further comprising:
   determining a first selection vector based on first outputs of first output stages of the plurality of output stages, wherein the first outputs are generated by the first output stages when the input signal is being converted by the pipelined ADC; and
   determining a second selection vector based on second outputs of the first output stages, wherein the second outputs are generated by the first output stages when the scaled version of the input signal is being converted by the pipelined ADC, wherein calibrating the pipelined ADC comprises calibrating the pipelined ADC using the first digital output, the second digital output, the first selection vector, and the second selection vector.

8. The method of claim 7, wherein each component of the first selection vector has a value of zero or one, and is determined by the first outputs of the first output stages, wherein each component of the second selection vector has a value of zero or one, and is determined by the second outputs of the first output stages.

9. The method of claim 8, wherein updating the parameter vector comprises:
   computing a first corrected digital output by adding the first digital output with a product of a transpose of the first selection vector and the parameter vector;
   computing a second corrected digital output by adding the second digital output with a product of a transpose of the second selection vector and the parameter vector;
   computing a first difference between the second corrected digital output and a product of a digital scale factor and the first corrected digital output, wherein the digital scale factor is an estimate of the scale factor;
   computing a first vector by subtracting a product of the first selection vector and the digital scale factor from the second selection vector; and
   updating the parameter vector by subtracting a product of the first vector, the first difference, and a first step size from the parameter vector.

10. The method of claim 9, further comprises updating the digital scale factor using the first digital output, the second digital output, the first selection vector, and the second selection vector.

11. The method of claim 10, wherein updating the digital scale factor comprises updating the digital scale factor by adding a product of the first difference, the first corrected digital output, and a second step size to the digital scale factor.

12. The method of claim 2, further comprising:
   stopping the first calibration process, wherein after the first calibration process is stopped, update of the parameter vector is stopped, and the components of the parameter vector retain values achieved at the end of the first calibration process; and operating the pipeline ADC in a normal operation mode, comprising:
  converting an input analog signal of the pipelined ADC into a digital output; and
  generating a calibrated ADC output by adding a correction term to the digital output, wherein the correction term is determined based on the parameter vector and at least one stage output of an output stage of the plurality of output stages.

13. The method of claim 3, further comprising:
  after a start-up or a reset of the pipelined ADC, performing a second calibration process using a signal source generated by a signal generator that sweeps across a full input range of the pipelined ADC, wherein the second calibration process performs the same processing as the first calibration process but replaces the input signal with the signal source and replaces the scaled version of the input signal with a scaled version of the signal source; and
  after the second calibration process is completed, operating the pipelined ADC in the hybrid calibration-conversion operation mode.

14. The method of claim 8, wherein updating the parameter vector comprises:
  computing a first scalar by subtracting a product of the first digital output and the scale factor from the second digital output;
  computing a first vector by subtracting a product of the first selection vector and the scale factor from the second selection vector;
  computing a second scalar by adding the first scalar and a product of a transpose of the first vector and the parameter vector;
  computing a second vector by multiplying the first vector with the second scalar and a step size; and
  updating the parameter vector by subtracting the second vector from the parameter vector.

15. The method of claim 14, further comprising computing a first calibrated output for the input signal by adding a product of a transpose of the first selection vector and the parameter vector to the first digital output.

16. An analog-to-digital converter system comprising:
  an input terminal configured to receive an input signal;
  a pipelined analog-to-digital converter (ADC);
  a first path between the input terminal and the pipelined ADC, wherein when selected, the first path couples the input terminal to the pipelined ADC;
  a second path between the input terminal and the pipelined ADC, wherein the second path comprises a scaling circuit configured to scale a signal by a scale factor, wherein when selected, the second path sends a scaled version of the input signal to the pipelined ADC;
  selection circuits configured to select the first path or the second path based on a control signal of the analog-to-digital converter system; and
  a correction circuit configured to generate a first corrected output for the pipelined ADC based on a first digital output of the pipelined ADC, wherein the first digital output is an output of the pipelined ADC when the first path is selected.

17. The analog-to-digital converter system of claim 16, wherein the correction circuit is configured to generate the first corrected output by adding a product of a transpose of a first selection vector and a parameter vector to the first digital output, wherein the parameter vector comprises components for correcting non-linear characteristics of the pipelined ADC, and the first selection vector selects corresponding components of the parameter vector based on stage outputs of first output stages of the pipelined ADC when the input signal is being converted by the pipelined ADC.

18. The analog-to-digital converter system of claim 17, further comprising a sample-and-hold (S/H) circuit coupled between the input terminal and the first and second paths, wherein the S/H circuit is configured to store the input signal.

19. The analog-to-digital converter system of claim 18, wherein the analog-to-digital converter system is configured to update the parameter vector by:
  storing, by the S/H circuit, the input signal received at the input terminal;
  selecting the first path to send the input signal to the pipelined ADC;
  converting the input signal into the first digital output and determining the first selection vector corresponding to the input signal;
  selecting the second path to send the scaled version of the input signal to the pipeline ADC;
  converting the scaled version of the input signal into a second digital output and determining a second selection vector corresponding to the scaled version of the input signal; and
  updating the parameter vector using the first digital output, the second digital output, the first selection vector, and the second selection vector.

20. The analog-to-digital converter system of claim 19, wherein updating the parameter vector comprises:
  computing a first corrected digital output by adding the first digital output with a product of a transpose of the first selection vector and the parameter vector;
  computing a second corrected digital output by adding the second digital output with a product of a transpose of the second selection vector and the parameter vector;
  computing a first difference between the second corrected digital output and a product of the scale factor and the first corrected digital output;
  computing a first vector by subtracting a product of the first selection vector and the scale factor from the second selection vector; and
  updating the parameter vector by subtracting a product of the first vector, the first difference, and a step size from the parameter vector.

* * * * *